(12) United States Patent
Li et al.

(10) Patent No.: US 9,086,522 B1
(45) Date of Patent: *Jul. 21, 2015

(54) DEVICES FOR COMMUNICATING OPTICAL SIGNALS AND ELECTRICAL SIGNALS OVER NANOTUBES

(75) Inventors: Angela Wai-an Li, Everett, WA (US); Jeffrey H. Hunt, Thousand Oaks, CA (US); Wayne R. Howe, Irvine, CA (US)

(73) Assignee: THE BOEING COMPANY, Chicago, IL (US)

( * ) Notice: Subject to any disclaimer, the term of this patent is extended or adjusted under 35 U.S.C. 154(b) by 264 days.

This patent is subject to a terminal disclaimer.

(21) Appl. No.: 13/482,691

(22) Filed: May 29, 2012

(51) Int. Cl.
| | |
|---|---|
| *G02B 6/02* | (2006.01) |
| *G02B 6/00* | (2006.01) |
| *H01B 1/04* | (2006.01) |
| *B82Y 20/00* | (2011.01) |
| *G02B 6/122* | (2006.01) |
| *H01L 51/00* | (2006.01) |
| *G02B 6/12* | (2006.01) |

(52) U.S. Cl.
CPC ............... *G02B 6/0229* (2013.01); *B82Y 20/00* (2013.01); *G02B 6/1221* (2013.01); *H01B 1/04* (2013.01); *H01L 51/0048* (2013.01); *G02B 2006/12035* (2013.01)

(58) Field of Classification Search
CPC ........ H01B 1/04; B82Y 20/00; G02B 6/0229; G02B 6/1221; H01L 51/0048
USPC .......................................... 385/123, 141–143
See application file for complete search history.

(56) References Cited

U.S. PATENT DOCUMENTS

| | | | |
|---|---|---|---|
| 7,491,883 | B2 | 2/2009 | Lee et al. |
| 8,233,758 | B2 | 7/2012 | Donval et al. |
| 8,247,036 | B2 | 8/2012 | Jiang et al. |
| 8,363,873 | B2 | 1/2013 | Liu et al. |
| 8,421,448 | B1 * | 4/2013 | Tran et al. ................. 324/207.2 |
| 2004/0168527 | A1 * | 9/2004 | Nakayama et al. ........ 73/864.41 |
| 2007/0107103 | A1 * | 5/2007 | Kempa et al. ................. 977/834 |
| 2008/0203380 | A1 * | 8/2008 | Wang et al. ....................... 257/9 |
| 2008/0254675 | A1 | 10/2008 | Lee et al. |
| 2009/0075035 | A1 | 3/2009 | O'Brien et al. |
| 2009/0196982 | A1 | 8/2009 | Jiang et al. |
| 2011/0051973 | A1 | 3/2011 | Liu et al. |
| 2011/0240111 | A1 * | 10/2011 | Yamazaki et al. ............ 136/256 |

OTHER PUBLICATIONS

Khan et al (The Feasibility of Carbon Nanotubes for Power Delivery in 3-D Integrated Circuits, Design Automation Conference (ASP-DAC), 2012 17th Asia and South Pacific, pp. 53-58, Jan. 30, 2012-Feb. 2, 2012).*
PCT search report dated Jul. 3, 2013 regarding application PCT/US2013/042199, international filing date May 22, 2013, applicant The Boeing Company, 10 pages.

(Continued)

*Primary Examiner* — Ryan Lepisto
(74) *Attorney, Agent, or Firm* — Yee & Associates, P.C.

(57) ABSTRACT

A method and apparatus for a device configured to communicate using an optical signal and an electrical signal through a connection to a tube comprised of a number of layers of carbon forming a wall of the tube. The number of layers of carbon has a number of optical properties configured to propagate the optical signal and a number of electrical properties configured to conduct the electrical signal.

19 Claims, 9 Drawing Sheets

(56) References Cited

OTHER PUBLICATIONS

Mizuno et al., "A black body absorber from vertically aligned single-walled carbon nanotubes," Proceedings of the National Academy of Science, U.S.A., Apr. 2006, vol. 16, No. 15, pp. 6044-6047, published online Apr. 2009, accessed Aug. 6, 2013, http://www.ncbi.nlm.nih.gov/pmc/articles/PMC2669394/?tool=pmcentrez.

Howe et al., "Nanotube Signal Transmission System," U.S. Appl. No. 13/482,768, filed May 29, 2012, 44 Pages.

Neto et al., "The Electronic Properties of Graphene," Reviews of Modern Physics, vol. 81, Jan. 2009, pp. 109-162.

Falkovsky, "Optical Properties of Graphene," Journal of Physics: Conference Series 129, Jul. 2008, pp. 1-7.

Bonaccorso et al., "Graphene Properties and Optoelectronics," Nature Photonics, vol. 4, Sep. 2010, pp. 611-622.

Office Action, dated May 22, 2014, regarding U.S. Appl. No. 13/482,768, 17 pages.

Final Office Action, dated Aug. 14, 2014, regarding U.S. Appl. No. 13/482,768, 12 pages.

Office Action, dated Dec. 10, 2014, regarding U.S. Appl. No. 13/482,768, 15 pages.

Notice of Allowance, dated Apr. 22, 2015, regarding U.S. Appl. No. 13/482,768, 12 pages.

* cited by examiner

DEVICES FOR COMMUNICATING OPTICAL SIGNALS AND ELECTRICAL SIGNALS OVER NANOTUBES

CROSS REFERENCE TO RELATED CASE

This application is related to the following patent application: entitled "Nanotube Signal Transmission System", Ser. No. 13/482,768, filed even date hereof, assigned to the same assignee, and incorporated herein by reference.

BACKGROUND INFORMATION

1. Field

The present disclosure relates generally to transmitting information and, in particular, to transmitting optical signals and electrical signals. Still more particularly, the present disclosure relates to a method and apparatus for transmitting optical signals and electrical signals using nanotubes.

2. Background

In aircraft, satellites, vessels, submarines, vehicles, power transmission lines, communication lines, and other situations, reducing the size and weight of equipment is desirable. For example, reducing the weight and size of communications links used to transmit signals may be desirable. These communications links may transmit information, power, or both information and power. Electrical wires are commonly used in aircraft and other mobile platforms, as well as power transmission lines, communication lines, and other environments to transmit signals between various devices.

The wires and insulation used to form the communications and/or power links may be heavier than desired. Further, as the number of wires increase, the space needed for the wires may increase more than desired.

One alternative involves using communications links formed through optical fibers. An optical fiber is a flexible, transparent fiber that may be made of a material such as silica. One or more of these optical fibers may be placed in a cladding with a sheath around the cladding to form an optical fiber cable. Optical fiber cables may be much thinner and lighter as compared to wires used to carry electrical signals. However, optical fibers may still have a size and weight that is greater than desired.

Therefore, it would be desirable to have a method and apparatus that takes into account at least some of the issues discussed above, as well as other possible issues.

SUMMARY

In one illustrative embodiment, an apparatus comprises a device configured to communicate using an optical signal and an electrical signal through a connection to a tube comprised of a number of layers of carbon forming a wall of the tube. The number of layers of carbon has a number of optical properties configured to propagate the optical signal and a number of electrical properties configured to conduct the electrical signal.

In another illustrative embodiment, a communications system comprises a first device and a second device. The first device is configured to transmit an optical signal and an electrical signal using a tube comprised of a number of layers of carbon forming a wall of the tube. The number of layers of carbon has a number of optical properties configured to propagate the optical signal and a number of electrical properties configured to conduct the electrical signal simultaneously. The second device is configured to receive the optical signal and the electrical signal using the tube.

In yet another illustrative embodiment, a method is present for communicating. A device communicating at least one of an optical signal and an electrical signal using a tube comprised of a number of layers of carbon forming a wall of the tube. The number of layers of carbon has a number of optical properties configured to propagate the optical signal and a number of electrical properties configured to conduct the electrical signal. The device is configured to communicate using both the optical signal and the electrical signal.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

The illustrative embodiments recognize and take into account one or more different considerations. For example, the illustrative embodiments recognize and take into account that carbon nanotubes may be used in place of optical fibers. These carbon nanotubes may be much thinner in diameter as compared to an optical fiber. For example, an optical fiber may have a diameter from about 0.25 millimeters to about 0.5 millimeters. In contrast, a nanotube may have a diameter of about 1 nanometer, although the diameter may vary. In other words, an optical fiber that is about 0.5 millimeters thick is about 500,000 times thicker than a nanotube having a diameter of about 1 nanometer.

The illustrative embodiments recognize and take into account that a carbon nanotube may be selected to have properties to propagate optical signals through a channel in the nanotube. In this manner, communications links formed using carbon nanotubes may be lighter in weight and take up less space as compared to optical fibers.

Further, the illustrative embodiments also recognize and take into account that oftentimes, devices within a communications system may use different types of signal propagation. For example, the illustrative embodiments recognize and take into account that some devices may use optical signals, while other devices may use electrical signals. As a result, an aircraft or other platform in which communications links are implemented may use both wires and optical fibers. With these designs, some of the weight and size savings from optical fibers may be lost. Additionally, the designs for these communications systems take into account the devices that may be used within the communications system. If devices may be interchanged that use different types of signal propagation, then both a wire and an optical fiber need to be present. The presence of both types of communications links for increased flexibility may further increase the size and weight of the communications links beyond what is desirable.

The illustrative embodiments also recognize and take into account that even when optical fibers are used, additional wires may be needed to provide power to the devices because currently used optical fibers are unable to carry power. Optical cables may include a conductive sheath or a wire in addition to the optical fibers that conduct electrical signals. These electrical signals may be used for information and power. Optical fibers that include these components, however, may be thicker and heavier than desired.

Thus, the illustrative embodiments provide a method and apparatus for transmitting signals of different types within a single communications link. In these illustrative examples, an apparatus comprises a tube that is comprised of a number of layers of carbon forming a wall. The number of layers of carbon has a number of optical properties configured to propagate an optical signal and a number of electrical properties configured to conduct an electrical signal. In this manner, the same communications link may be used to transmit both types of signals. Further, the communications link also may be used to transmit information in an optical signal while transmitting power in an electrical signal for a device.

Figure 1:
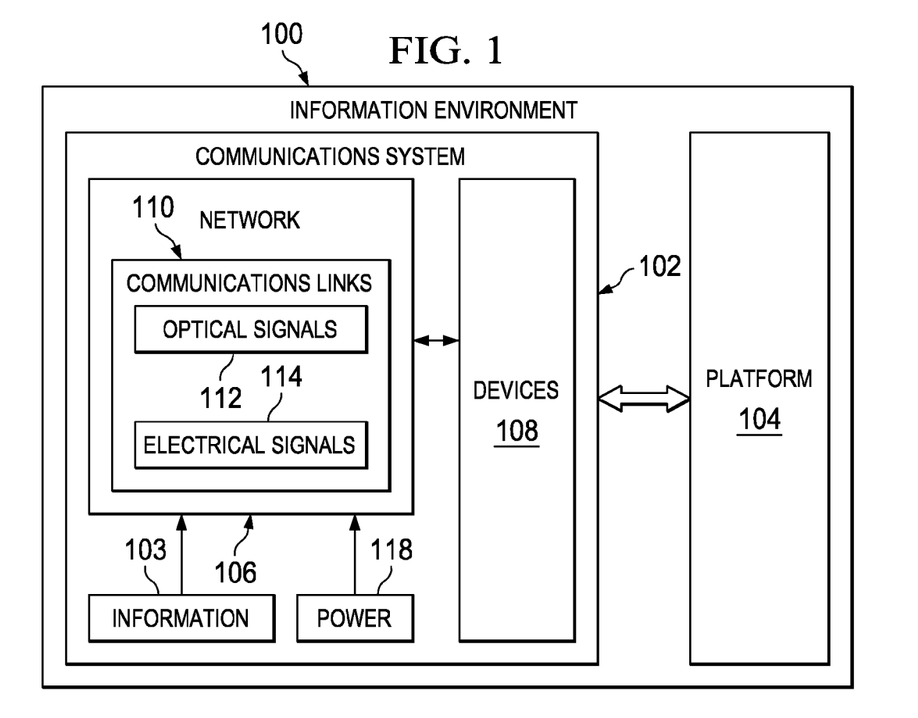
FIG. 1 is an illustration of a block diagram of an information environment in accordance with an illustrative embodiment.

With reference now to the figures, and in particular, with reference to FIG. 1, an illustration of a block diagram of an information environment is depicted in accordance with an illustrative embodiment. In this depicted example, information environment 100 includes communications system 102.

Communications system 102 may be used to transmit information 103. This information may take a number of different forms. For example, information 103 may be images, data, video, programs, commands, voice, and other types of information.

Communications system 102 may be associated with platform 104. When one component is "associated" with another component, the association is a physical association in these depicted examples. For example, a first component, communications system 102, may be considered to be associated with a second component, platform 104, by being secured to the second component, bonded to the second component, mounted to the second component, welded to the second component, fastened to the second component, and/or connected to the second component in some other suitable manner. The first component also may be connected to the second component using a third component. The first component may also be considered to be associated with the second component by being formed as part of and/or an extension of the second component.

As used herein, a "number of" when used with reference to items means one or more items. For example, a number of forms is one or more different forms. As another example, a number of layers of carbon may mean a single layer of carbon.

In these illustrative examples, platform 104 may take a number of different forms. For example, without limitation, platform 104 may be a mobile platform, a stationary platform, a land-based structure, an aquatic-based structure, and a space-based structure. More specifically, platform 104, may be a surface ship, a tank, a personnel carrier, a train, a spacecraft, a space station, a satellite, a submarine, an automobile, a power plant, a bridge, a dam, a manufacturing facility, a building, a telephone communications system, a cable television network, and undersea cable, a high power transmission system, a communications system, and other suitable platforms.

As depicted, communications system 102 comprises network 106 and devices 108. In these illustrative examples, devices 108 are hardware devices. Devices 108 may take a number of different forms. For example, devices 108 may include at least one of computers, tablet computers, sensors, actuators, repeaters, switches, routers, network nodes, and other suitable types of devices.

As used herein, the phrase "at least one of", when used with a list of items, means different combinations of one or more of the listed items may be used and only one of each item in the list may be needed. For example, "at least one of item A, item B, and item C" may include, without limitation, item A or item A and item B. This example also may include item A, item B, and item C, or item B and item C. In other examples, "at least one of" may be, for example, without limitation, two of item A, one of item B, and ten of item C; four of item B and seven of item C; and other suitable combinations.

Network 106 is comprised of communications links 110. Communications links 110 are hardware links in these illustrative examples. Communications links 110 are configured to carry optical signals 112, electrical signals 114, or both optical signals 112 and electrical signals 114 at the same time. Devices 108 may operate using optical signals 112, electrical signals 114, or both optical signals 112 and electrical signals 114.

In these illustrative examples, information 103 may be exchanged by devices 108 using optical signals 112, electrical signals 114, or both. Additionally, power 118 may be supplied to a portion of devices 108 through electrical signals 114 transmitted within network 106 in communications system 102 in these illustrative examples. In other words, one or more of devices 108 may receive power from network 106. In other illustrative examples, power 118 also may be supplied through optical signals 112. Thus, power 118 may be supplied using at least one of optical signals 112 and electrical signals 114.

Figure 2:
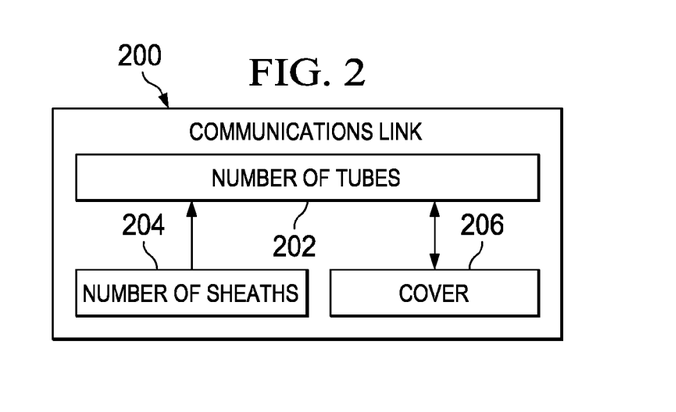
FIG. 2 is an illustration of a block diagram of a communications link in accordance with an illustrative embodiment.

Turning now to FIG. 2, an illustration of a block diagram of a communications link is depicted in accordance with an illustrative embodiment. In this depicted example, communications link 200 is an example of a communications link in communications links 110 in FIG. 1.

As depicted, communications link 200 includes number of tubes 202. Number of tubes 202 may be configured to provide a desired index of refraction for optical signals 112 in FIG. 1. Number of tubes 202 may be a single tube. In other words, a number of additional tubes may be present in addition to the tube when number of tubes 202 includes more than one tube.

Each tube in number of tubes 202 may be covered by number of sheaths 204. When more than one tube is present in number of tubes 202, the number of additional tubes may be further covered by cover 206.

As depicted, a sheath in number of sheaths 204 is an insulating sheath. Number of sheaths 204 may provide insulation for electrical signals in these illustrative examples. Additionally, number of sheaths 204 also may be configured to provide a desired index of refraction for optical signals 112 in FIG. 1 that may pass through walls in number of tubes 202. Further, number of sheaths 204 may be configured to provide optical absorption of stray photons that pass through the walls at an incidence that is greater than the index of refraction.

Figure 3:
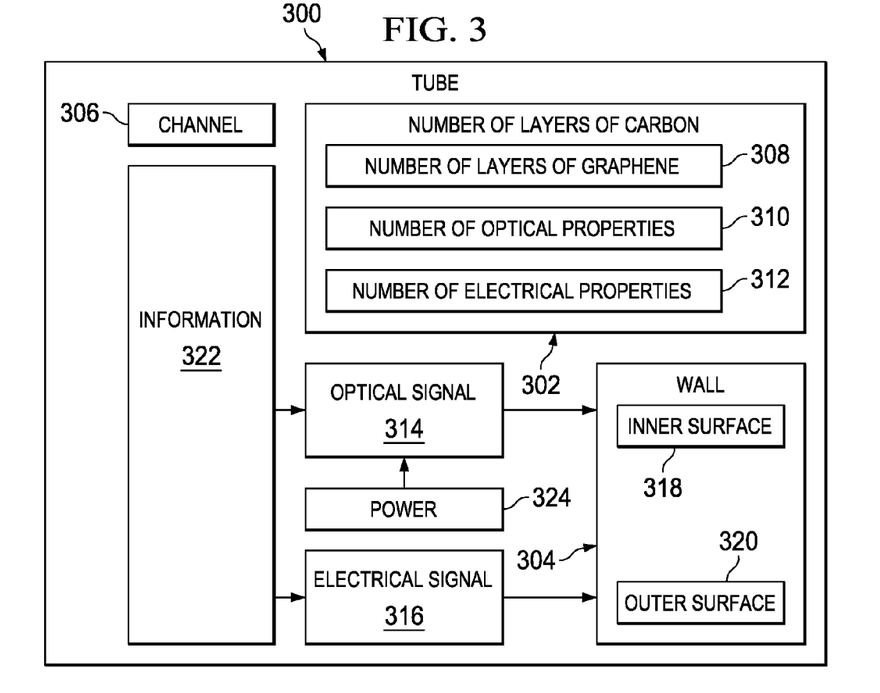
FIG. 3 is an illustration of a block diagram of a tube in accordance with an illustrative embodiment.

Turning now to FIG. 3, an illustration of a block diagram of a tube is depicted in accordance with an illustrative embodiment. In this illustrative example, tube 300 is an example of a tube in number of tubes 202 for communications link 200 in FIG. 2.

In these illustrative examples, tube 300 is comprised of number of layers of carbon 302 that form wall 304. Channel 306 extends through tube 300. As depicted, number of layers of carbon 302 may take the form of number of layers of graphene 308. In other words, tube 300 may be a graphene tube and, more specifically, may be a graphene nanotube. Thus, network 106 may be comprised of graphene nanotubes used to exchange electrical signals between a number of devices 108 in communications system 102.

Number of layers of carbon 302 may be, for example, one, two, three, or some other suitable number of layers. In other words, number of layers of carbon 302 for tube 300 may be a single layer of carbon. In some illustrative examples, tube 300 may include a number of additional layers of carbon in addition to the layer of carbon when number of layers carbon 302 includes more than one layer.

In these illustrative examples, number of layers of carbon 302 that form tube 300 have number of optical properties 310 and number of electrical properties 312. Number of optical properties 310 for number of layers of carbon 302 is configured to propagate optical signal 314. Number of electrical properties 312 for number of layers of carbon 302 is configured to conduct electrical signal 316. In these illustrative examples, both optical signal 314 and electrical signal 316 may travel through tube 300 at substantially the same time. Optical signal 314 is an example of an optical signal in optical signals 112 in FIG. 1. Electrical signal 316 is an example of an electrical signal in electrical signals 114 in FIG. 1.

Number of optical properties 310 may include an index of refraction. For example, the index of refraction may be higher or lower than air, vacuum, or the index of refraction of some other medium in channel 306 in which index of refraction allows channel 306 within tube 300 to act as a hollow core in an optical fiber. In other words, channel 306 may include a material through which photons propagate in some illustrative examples.

The index of refraction may be controlled through parameters, such as the density of the nanotubes. In one illustrative example, the density may be the density of the tube, the number of tubes within a given volume, or both. The index of refraction may control the relative alignment of the tube with respect to each other.

Resistivity, impedance, capacitance, and conductivity are examples of electrical properties in number of electrical properties 312. In these illustrative examples, a lower resistivity or higher conductivity is desired. In particular, the resistivity is selected to be low enough to conduct electrons in a desired manner.

In these illustrative examples, optical signal 314 may propagate through channel 306 inside tube 300. As depicted, optical signal 314 may have various wavelengths. These wavelengths may be for visible light, infrared light, ultraviolet light, or other wavelengths. For example, the wavelengths for optical signal 314 may be from about 10 nanometers to about 400 micrometers.

Electrical signal 316 may propagate along wall 304 of tube 300. Propagation of electrical signal 316 may be along inner surface 318 of wall 304, outer surface 320 of wall 304, or both.

As depicted, tube 300 is configured to transmit information 322 in at least one of optical signal 314 and electrical signal 316. Additionally, tube 300 also is configured to transmit power 324 using at least one of optical signal 314 and electrical signal 316.

In some illustrative examples, different layers in number of layers of carbon 302 may have various orientations. These orientations may have different angles and may form at least one of zigzag nanotubes, armchair nanotubes, and chiral nanotubes. These different types of orientations for number of layers of carbon 302 may be selected to modify the electrical, optical, and or chemical properties of tube 300.

Further, additional number of layers of other materials may be added to tube 300 to modify the electrical, optical, and or chemical properties of tube 300. For example, one or more layers of carbon, graphene, or other materials may be added to form insulation, create inductance, create capacitance, modify the index of refraction, protect the tube from chemical changes, and/or for other purposes.

Figure 4:
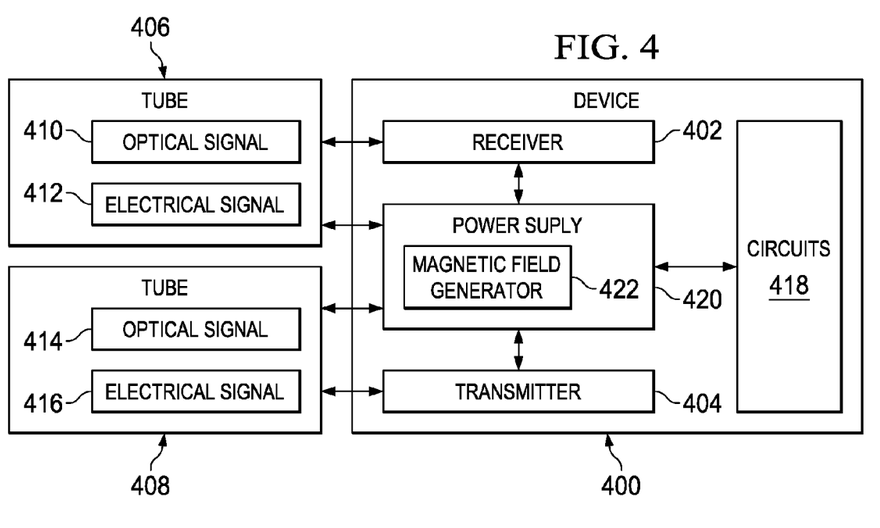
FIG. 4 is an illustration of a block diagram of a device in accordance with an illustrative embodiment.

With reference now to FIG. 4, an illustration of a block diagram of a device is depicted in accordance with an illustrative embodiment. In this depicted example, device 400 is an example of a device within devices 108 in FIG. 1.

In these illustrative examples, device 400 may communicate using at least one of an optical signal and an electrical signal through a connection through a tube. As depicted, device 400 includes at least one of receiver 402 and transmitter 404.

Receiver 402 and transmitter 404 are hardware and may include software. Receiver 402 and transmitter 404 may be implemented using circuits. These circuits may be configured to generate or process electrical signals, optical signals, or both electrical signals and optical signals. For example, transmitter 404 may include an encoder to encode information in an electrical signal. In a similar fashion, receiver 402 may include a decoder to retrieve information from an electrical signal.

In this illustrative example, receiver 402 is in communication with tube 406, while transmitter 404 is in communication with tube 408. Tube 406 and tube 408 may be a tube such as tube 300 in FIG. 3. In particular, tube 406 and tube 408 may be in the same communications link in these illustrative examples. For example, tube 406 and tube 408 may be tubes in number of tubes 202 in communications link 200 in FIG. 2. In other illustrative examples, these two tubes may be in separate communications links.

In this illustrative example, receiver 402 is configured to receive optical signal 410 and electrical signal 412 through tube 406. Transmitter 404 is configured to transmit optical signal 414 and electrical signal 416 through tube 408.

In these illustrative examples, the optical signals and the electrical signals may be sent and/or received at substantially the same time. For example, optical signal 410 and electrical signal 412 may be received through tube 406 at the same time. In a similar fashion, optical signal 414 and electrical signal 416 may be transmitted through tube 408 at the same time.

In some illustrative examples, electrical signal 412 may be used to provide power for one or more circuits within device 400. For example, electrical signal 412 may be configured to provide power to at least one of receiver 402 and transmitter 404 as well as one or more of circuits 418. Circuits 418 may take various forms. For example, circuits 418 may include at least one of an amplifier, a buffer, a memory, a processor unit, and other suitable types of circuits.

In these illustrative examples, information may be transmitted using at least one of both optical signal 414 and electrical signal 416. When both optical signal 414 and electrical signal 416 are used to transmit information, these signals may be transmitted at the same time through tube 408.

In some illustrative examples, device 400 may also include power supply 420. Power supply 420 may be used to send power using electrical signal 416. Power supply 420 may take various forms. For example, power supply 420 may be a generator that generates electrical energy from other forms of energy. In other illustrative examples, power supply 420 may control properties of electrical signal 416 such as voltage, current, and other suitable properties. For example, power supply 420 may convert alternating current to direct current or vice versa when sending electrical signal 416 using tube 408.

In other illustrative examples, power supply 420 in device 400 may receive electrical signal 412 and send electrical signal 412 to different circuits in device 400.

In other illustrative examples, power supply 420 may be used to derive power from electrical signal 412 indirectly using the Hall Effect. In addition to using current in electrical signal 412 to provide power to circuits within device 400, device 400 may derive power from electrical signal 412 indirectly.

For example, power supply 420 may include magnetic field generator 422. In these illustrative examples, magnetic field generator 422 may include at least one of a magnet, an electromagnet, and some other suitable type of device.

Magnetic field generator 422 is configured to generate a voltage difference between a first side and a second side of tube 406 when electrical signal 412 is received. A circuit, such as receiver 402, transmitter 404, or some other circuit in circuits 418 may be configured to operate using the voltage difference. In this manner, device 400 may derive power indirectly from electrical signal 412. Of course, electrical signal 412 also may be used directly to derive power for device 400. Electrical signal 412 may have a current used by circuits within device 400.

Additionally, magnetic field generator 422 also may be used with tube 408 when transmitter 404 transmits electrical signal 416. In this configuration, the voltage difference is present between a first side and a second side of tube 408. This voltage difference also may be used to power different circuits in device 400 such as at least one of receiver 402, transmitter 404, and circuits 418.

The illustration of information environment 100 and the different components in information environment 100 in FIGS. 1-4 are not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, information environment 100 also may include communications links that are comprised of wires and optical fibers. Further, in some illustrative examples, communications links 110 may include wireless communications links.

Further, in other illustrative examples, communications system 102 may span across more locations than just platform 104. For example, communications system 102 may be a local area network, a wide area network, an intranet, or some other suitable type of communications system. Further, in other illustrative examples, communications system 102 may be high voltage power transmission lines with inherent optical communications signaling.

Figure 5:
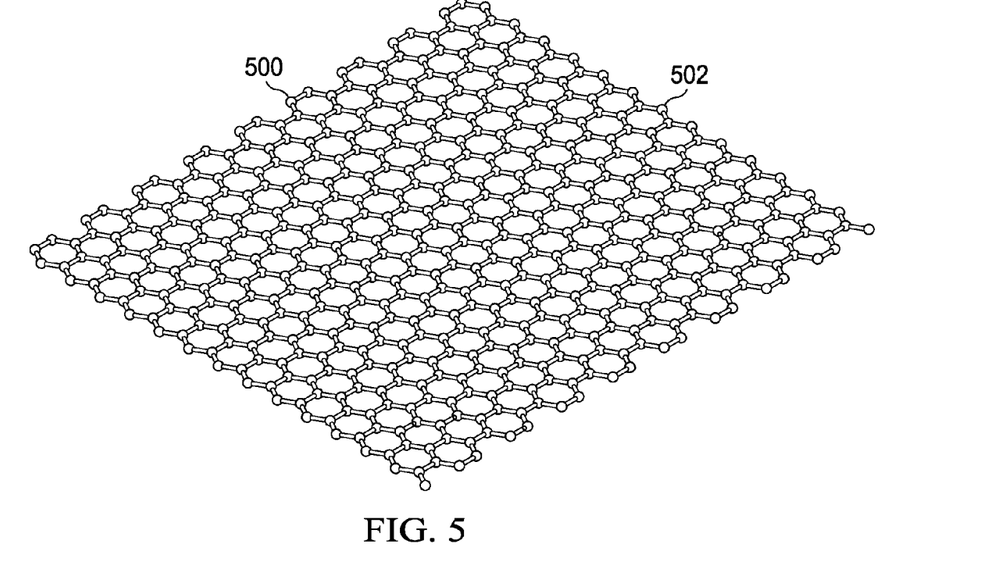
FIG. 5 is an illustration of a layer of carbon that may be used in a communications link in accordance with an illustrative embodiment.

Turning now to FIG. 5, an illustration of a layer of carbon that may be used in a communications link is depicted in accordance with an illustrative embodiment. In this depicted example, layer of carbon 500 is an example of a layer of carbon that may be used to form a tube such as tube 300 shown in block form in FIG. 3.

In this illustrative example, layer of carbon 500 takes the form of layer of graphene 502. Graphene is an allotrope of carbon. As depicted, layer of graphene 502 takes the form of a honeycomb lattice formed by carbon atoms.

In these illustrative examples, layer of graphene 502 provides desired electrical properties for conducting an electrical signal. For example, layer of graphene 502 has desired levels of electron mobility at room temperature. For example, the mobility may be about 15,000 $cm^2$ $v^{-1}$ $s^{-1}$ or greater. The resistivity of layer of graphene 502 may be about $10^{-6}$ ohms/cm at room temperature.

Figure 6:
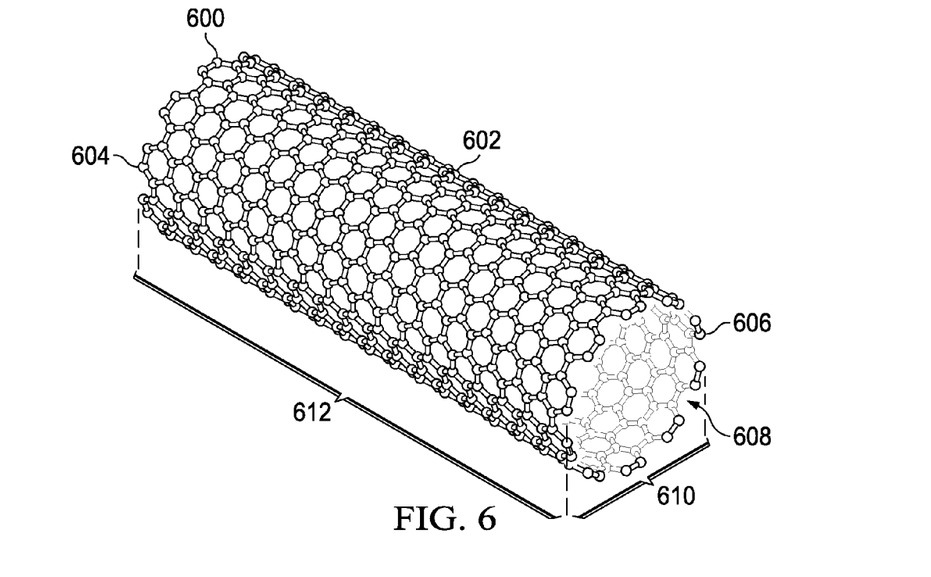
FIG. 6 is an illustration of a tube formed from a layer of graphene in accordance with an illustrative embodiment.

Turning now to FIG. 6, an illustration of a tube formed from a layer of graphene is depicted in accordance with an illustrative embodiment. In this illustrative example, layer of graphene 502 from FIG. 5 is in the shape of tube 600. In this illustrative example, tube 600 takes the form of nanotube 602. Nanotube 602 has end 604 and end 606. Channel 608 extends from end 604 to end 606 of nanotube 602.

Nanotube 602 has diameter 610. Diameter 610 may be, for example, about 0.4 nanometers to about 40 nanometers. However, diameter 610 may be any diameter depending on the implementation. For example, diameter 610 may be larger than 40 nanometers. In some illustrative examples, diameter 610 may be larger than normal for a nano structure.

In these illustrative examples, nanotube 602 has length 612. Length 612 may vary. For example, length 612 may be about 18.5 centimeters. However, graphene is one of the strongest materials known and length 612 may be any length that can be fabricated. Thus, length 612 also may be greater than about 18.5 centimeters. For example, length 612 may even be about 1 meter, about 1 kilometer or some other suitable length.

Figure 7:
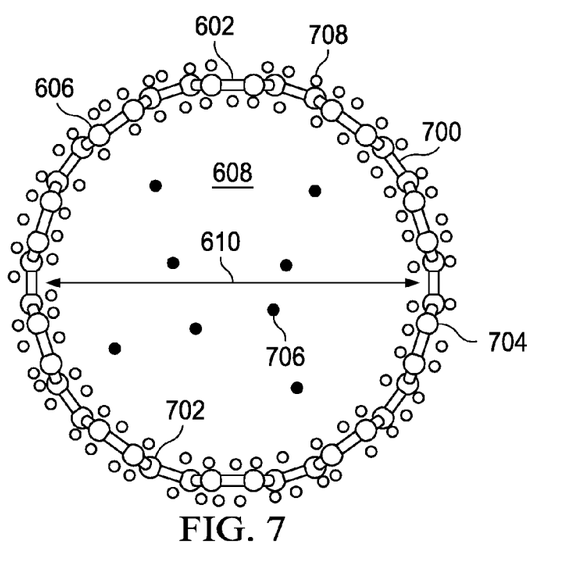
FIG. 7 is an illustration of an end of a nanotube in accordance with an illustrative embodiment.

Turning now to FIG. 7, an illustration of an end of a nanotube is depicted in accordance with an illustrative embodiment. In this depicted example, end 606 of nanotube 602 is depicted. In this illustrative example, wall 700 of nanotube 602 has inner surface 702 and outer surface 704.

As depicted, photons 706 for an optical signal may propagate through channel 608. As photons 706 propagate through channel 608, photons 706 may reflect off of inner surface 702 of wall 700. As depicted, the wavelength of photons 706 may affect the index of refraction for nanotube 602.

In these illustrative examples, photons 706 may continue to reflect off of inner surface 702 of wall 700 as long as the angle between the vector that a photon travels along and inner surface 702 of wall 700 is not greater than about 20 degrees. If the angle is greater than about 20 degrees, the photon may pass through wall 700. Additionally, electrons 708 may conduct along inner surface 702 of wall 700, outer surface 704 of wall 700, or conduct along both inner surface 702 and outer surface 704 of wall 700 for nanotube 602.

Depending on the length of nanotube 602, multiple nanotubes may be aligned with each other, bonded, or otherwise connected to each other to form a longer structure for a communications link. In other words, one end of a nanotube may be connected to an end of another nanotube such that the channels in the two nanotubes are in communication with each other.

Figure 8:
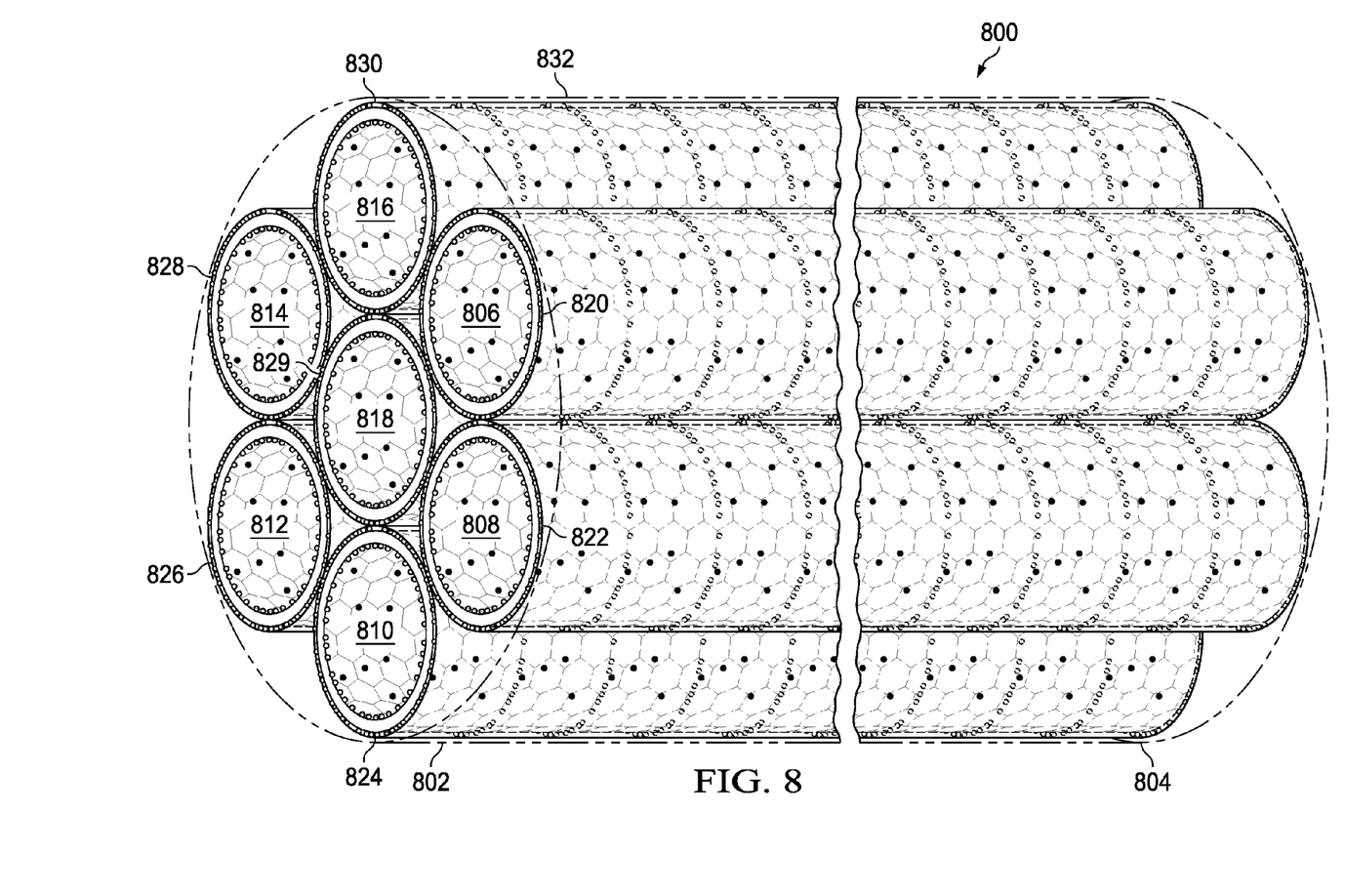
FIG. 8 is an illustration of a communications link in accordance with an illustrative embodiment.

Turning now to FIG. 8, an illustration of a communications link is depicted in accordance with an illustrative embodiment. In this depicted example, communications link 800 has end 802 and end 804. Communications link 800 is comprised of nanotubes 806, 808, 810, 812, 814, 816, and 818. These nanotubes may be nanotubes such as nanotube 602 shown in FIGS. 6-7.

In this illustrative example, sheaths 820, 822, 824, 826, 828, 829 and 830 cover nanotubes 806, 808, 810, 812, 814, 816, and 818, respectively. As a result, these nanotubes may be individually insulated such that multiple electrical signals may be transmitted through communications link 800.

If the different nanotubes are not individually insulated, then the nanotubes may carry the same electrical signal, but with reduced resistance, more electron flow, and higher power. Further, when the nanotubes are not individually insulated, different optical signals may still propagate through the channels of the different nanotubes.

Additionally, communications link 800 also includes cover 832. Cover 832 may be a protective cover and also may provide insulating properties depending on the particular implementation.

Figure 9:
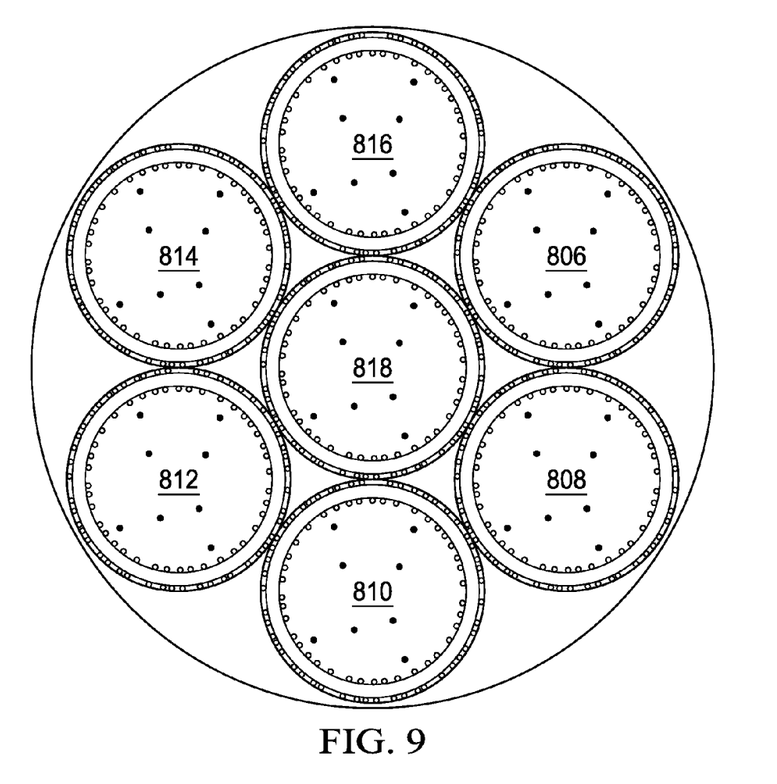
FIG. 9 is an illustration of an end of a communications link in accordance with an illustrative embodiment.

Turning now to FIG. 9, an illustration of an end of a communications link is depicted in accordance with an illustrative embodiment. In this illustrative example, end 802 of communications link 800 is shown.

Figure 10:
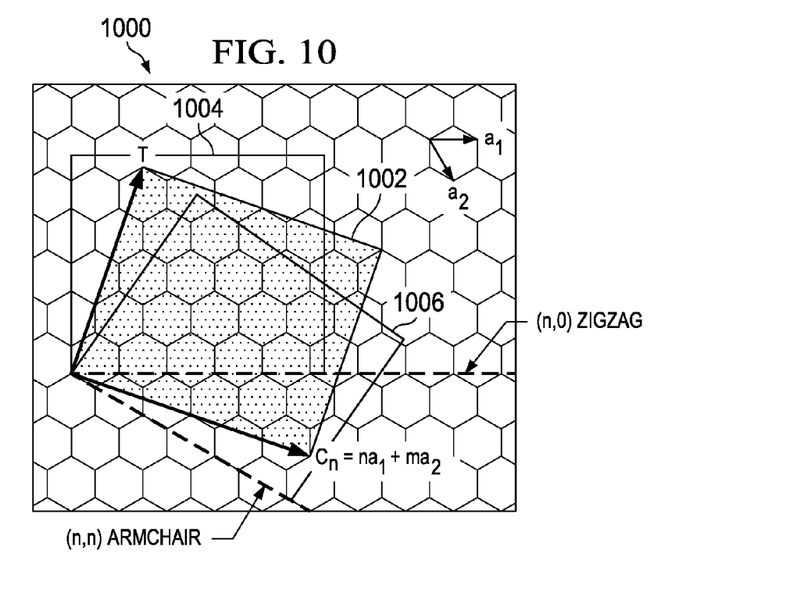
FIG. 10 is an illustration of different orientations for layers of carbon that may be selected to form different types of nanotubes in accordance with an illustrative embodiment.

With reference now to FIG. 10, an illustration of different orientations for layers of carbon that may be selected to form different types of nanotubes is depicted in accordance with an illustrative embodiment. In this illustrative example, sheet 1000 is a sheet of carbon. The arrangement of the carbon atoms in this sheet is in the form of graphene.

As depicted, layer 1002 may be formed from a portion of sheet 1000. Layer 1002 is an example of a layer that may be in number of layers of carbon 302 that form tube 300 in FIG. 3.

Layer 1004 also may be formed from sheet 1000. Layer 1004 may be formed into a tube that forms a zigzag nanotube in this illustrative example.

As another example, layer 1006 is another layer that may be formed from sheet 1000. Layer 1006 has an orientation that may be used to form an armchair nanotube. Of course, other orientations other than those illustrated here with different angles may be selected depending on the particular implementation.

Figure 11:
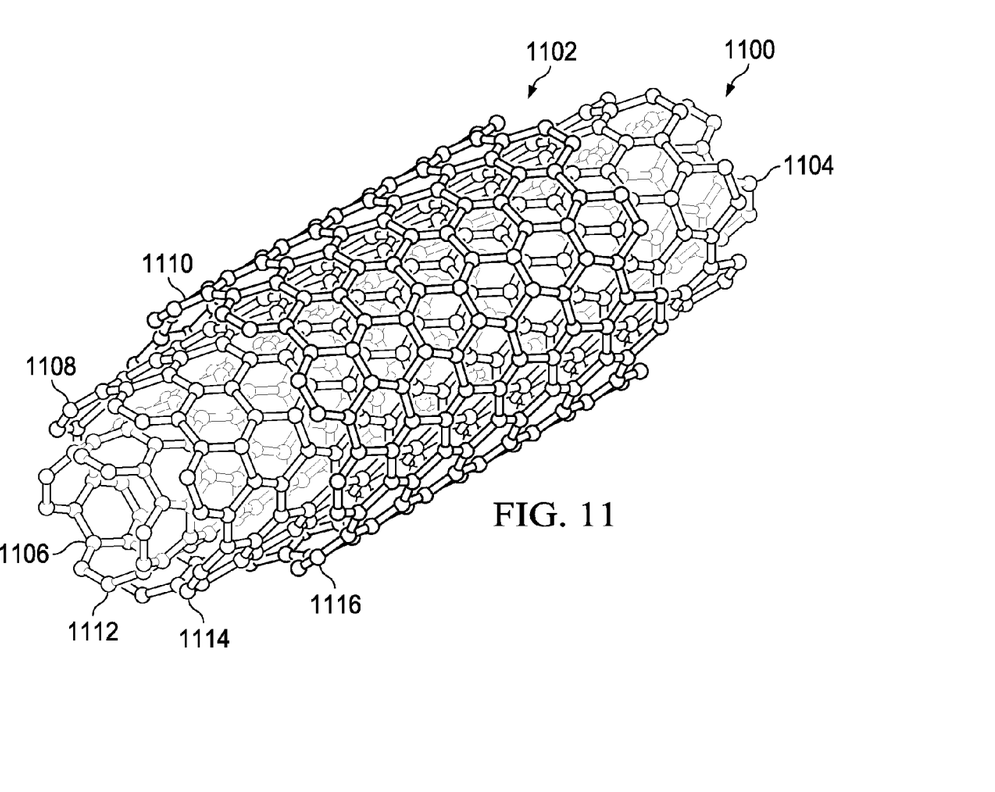
FIG. 11 is an illustration of a multi-walled nanotube in accordance with an illustrative embodiment.

Turning now to FIG. 11, an illustration of a multi-walled nanotube is depicted in accordance with an illustrative embodiment. In this illustrative example, nanotube 1100 may be comprised of layers of carbon 1102. These different layers of carbon form walls 1104. In particular, layers 1100 include layer 1106, layer 1108, and layer 1110. These layers form wall 1112, wall 1114, and wall 1116 for tube 1100.

Figure 12:
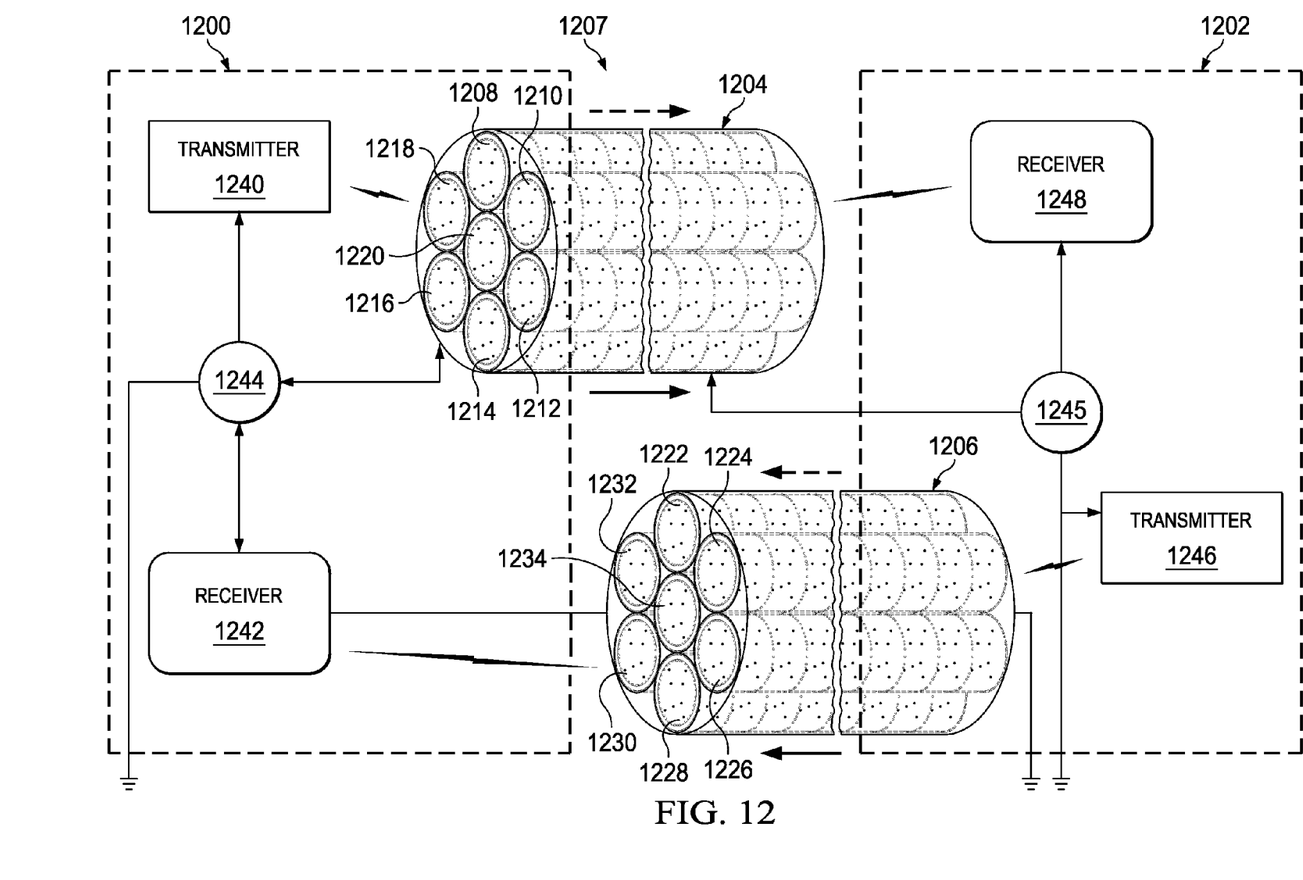
FIG. 12 is an illustration of devices connected to each other through nanotubes in accordance with an illustrative embodiment.

Turning now to FIG. 12, an illustration of devices connected to each other through nanotubes is depicted in accordance with an illustrative embodiment. In this depicted example, device 1200 and device 1202 may communicate with each other over communications link 1204 and communications link 1206. Communications link 1204 and communications link 1206 are formed from nanotubes 1207.

As depicted, communications link 1204 comprises tubes 1208, 1210, 1212, 1214, 1216, 1218, and 1220. Communications link 1206 comprises nanotubes 1222, 1224, 1226, 1228, 1230, 1232, and 1234.

As depicted, device 1200 includes transmitter 1240, receiver 1242, and power supply 1244. Device 1202 includes transmitter 1246, receiver 1248, and power supply 1245.

Transmitter 1240 and transmitter 1246 may be configured to transmit optical signals, electrical signals, or both optical signals and electrical signals. These transmitters may include an optical emitter such as a light emitting diode, a laser, and other suitable optical devices for generating optical signals. The transmitters also may include circuits configured to generate electrical signals.

These circuits in the transmitters may include, for example, analog to digital circuits, digital to analog circuits, voice communications circuits, video communications circuits, signaling circuits, multiplexer/demultiplexer circuits, radio-frequency circuits, control circuits, sensors, magnetic-electrical inductors, solar panels, power conversion circuits, direct current circuits, alternating current circuits, and any other suitable circuits.

Receiver 1242 and receiver 1248 are configured to receive optical signals, electrical signals, or both optical signals and electrical signals. These receivers may include a photo diode, a charge-coupled device, a photo multiplier, and other suitable optical signal detectors. The receivers also may include circuits configured to receive electrical signals.

These circuits in the receivers may include, for example, analog to digital circuits, digital to analog circuits, voice communication circuits, video communications circuits, signaling circuits, multiplexer/demultiplexer circuits, radio-frequency circuits, control circuits, sensor receiver circuits, electro-magnetic inductors, heat generators, power conversion circuits, direct current loads, alternating current loads, and any other suitable circuits.

Power supply 1244 is configured to generate electrical signals that may be used to power circuits. Power supply 1244 may be, for example, a direct current power supply, an alternating power supply, or some other suitable type of power supply device.

Power supply 1245 is configured to receive power generated by power supply 1244. Power supply 1245 includes circuits used to distribute the electrical signals to circuits within device 1202.

Of course, power supply 1245 also may be used to generate electrical signals used to power circuits outside of device 1202. Additionally, power supply 1244 also may be configured to receive electrical signals generated by power supply 1245 and distribute those electrical signals to circuits within device 1200.

In this illustrative example, transmitter 1240 may transmit photons into one or more of the nanotubes in communications link 1204. These photons may be received by receiver 1248 in device 1202 using one or more of nanotubes 1207 in communications link 1204.

In a similar fashion, transmitter 1240 also may send electrical signals through one or more of nanotubes 1207 in communications link 1204. These electrical signals may be received by receiver 1200. In some illustrative examples, the electrical signals sent through one or more of nanotubes 1207 in communications link 1204 may be used to power one or more circuits in device 1202. For example, the electrical signals may be used to power circuits in receiver 1248, transmitter 1246, or both of these circuits. In this illustrative example, power supply 1244 may generate electrical signals sent through one or more of tubes 1207 in communications link 1204 to receiver 1248.

Figure 13:
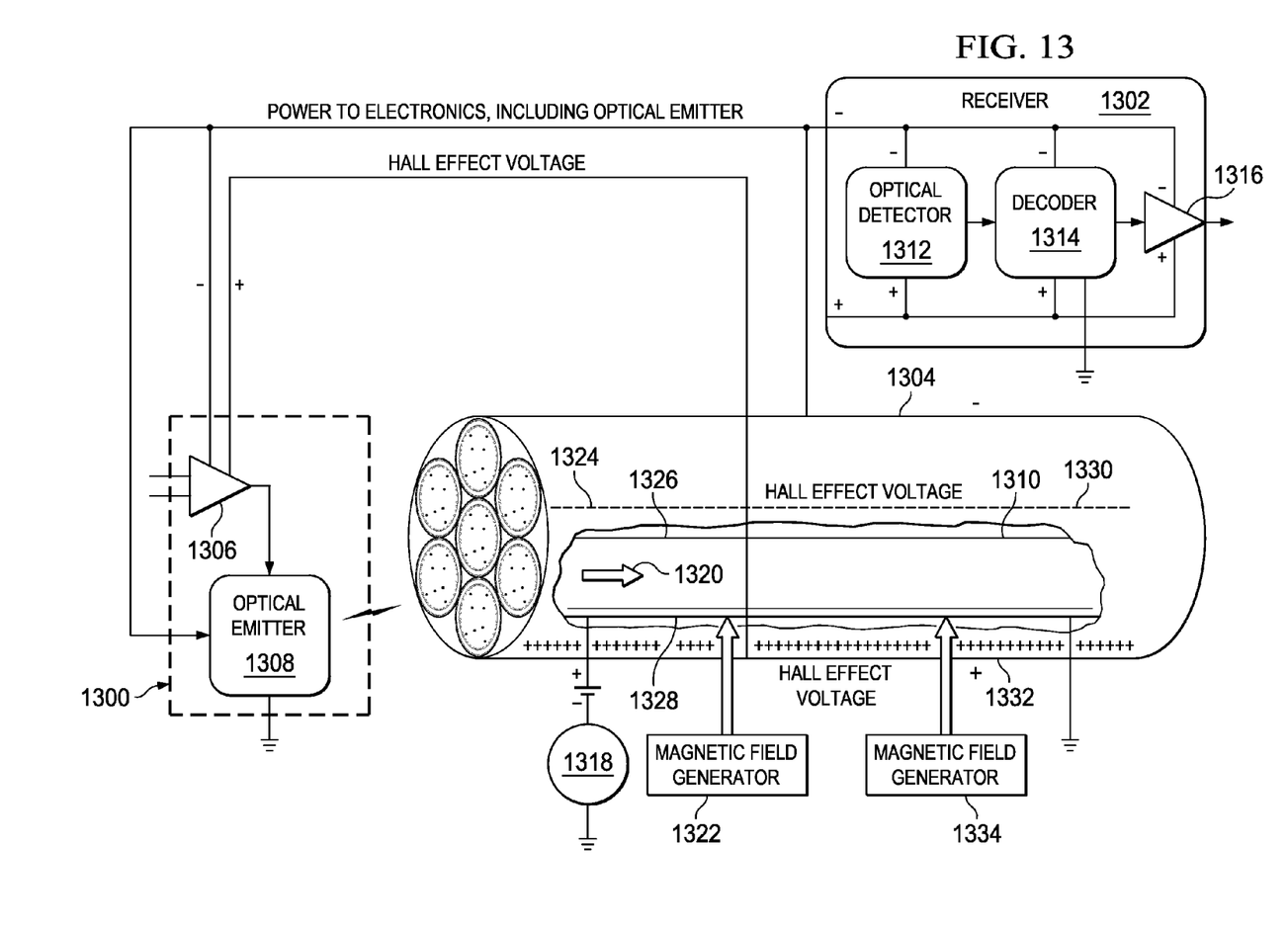
FIG. 13 is an illustration of devices powered by Hall Effect devices in accordance with an illustrative embodiment.

Turning now to FIG. 13, an illustration of devices powered by Hall Effect devices is depicted in accordance with an illustrative embodiment. In this illustrative example, transmitter 1300 and receiver 1302 may communicate with each other using communications link 1304.

Transmitter 1300 is an example of an implementation for transmitter 404 in FIG. 4. Receiver 1302 is an example of an implementation of receiver 402 in FIG. 4.

In this illustrative example, transmitter 1300 includes amplifier 1306 and optical emitter 1308. Amplifier 1306 is configured to amplify input signals for transmission to receiver 1302. These input signals are electrical signals in these illustrative examples. Optical emitter 1308 is configured to transmit optical signals through tube 1310 in communications link 1304 in response to receiving the input signals from amplifier 1306.

Receiver 1302 is configured to receive the optical signals. Receiver 1302 includes optical detector 1312, decoder 1314, and buffer 1316.

In this illustrative example, current source 1318 is connected to tube 1310 and is configured to send electrical signal 1320 through tube 1310. Electrical signal 1320 has a current level in these illustrative examples.

Further, magnetic field generator 1322 may be used to generate power for circuits within transmitter 1300. Magnetic field generator 1334 generates a magnetic field.

In this illustrative example, the magnetic field generated by magnetic field generator 1322 may cause voltage difference 1324 to occur as electrical signal 1320 travels through tube 1310. The magnetic field is applied to electrical signal 1320.

Voltage difference 1324 is a voltage difference between side 1326 and side 1328 of tube 1310. This voltage difference may extend to side 1330 and side 1332 of communications link 1304. Connections from side 1330 and side 1332 may be made to amplifier 1306 to supply power to amplifier 1306 and optical emitter 1308.

In a similar fashion, magnetic field generator 1334 may be configured to generate power for circuits within receiver 1302. Magnetic field generator 1334 generates a magnetic field. The magnetic field may cause voltage difference 1324 to occur when electrical signal 1320 passes through tube 1310. The magnetic field is applied to electrical signal 1320.

This voltage difference may be used to provide power to receiver 1302. In this illustrative example, optical detector 1312, decoder 1314, and other electronics 1316 are connected to side 1330 and side 1332 of tube 1310.

The illustration of the carbon layer, the nanotube, the communications link, and the devices in FIGS. 5-13 are not meant to imply physical or architectural limitations to the manner in which an illustrative embodiment may be implemented. For example, in some illustrative examples, communications link 800, communications link 1304, or both communications link 800 and communications link 1304 may be comprised of a single nanotube rather than multiple nanotubes.

In still other illustrative examples, additional layers may be present in nanotube 602 in addition to layer of graphene 502. For example, one or more additional layers of graphene may be present in forming nanotube 602.

FIGS. 5-13 may be combined with components in FIGS. 1-4, used with components in FIGS. 1-4, or a combination of the two. Additionally, some of the components in FIGS. 5-13 may be illustrative examples of how components shown in block form in FIGS. 1-4 can be implemented as physical structures.

Figure 14:
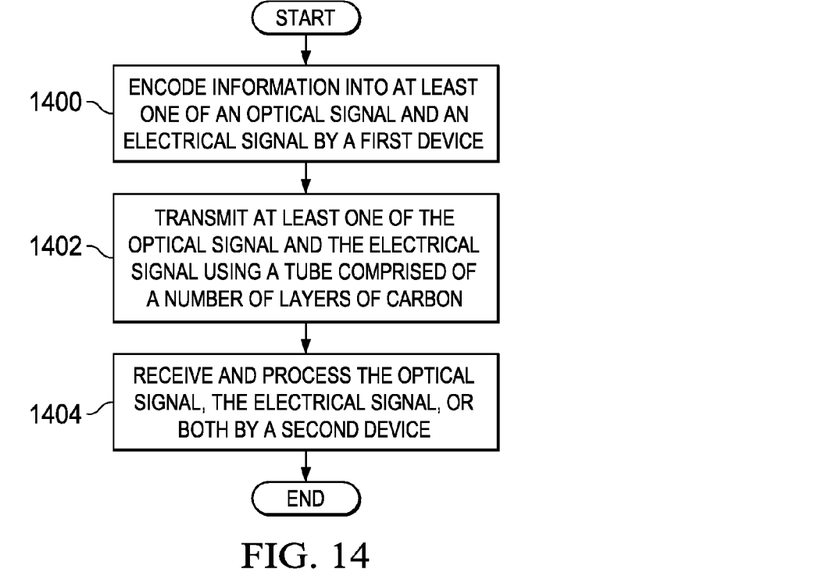
FIG. 14 is an illustration of a flowchart of a process for transmitting signals in accordance with an illustrative embodiment.

With reference now to FIG. 14, an illustration of a flowchart of a process for transmitting signals is depicted in accordance with an illustrative embodiment. The process illustrated in FIG. 14 may be implemented in information environment 100 in FIG. 1. In particular, the process may be implemented in communications links 110 formed using tubes, such as tube 300 in FIG. 3.

The process begins by a first device encoding information into at least one of an optical signal and an electrical signal (operation 1400). The first device may be a device in devices 108 in FIG. 1.

The process then transmits at least one of the optical signal and the electrical signal using a tube comprised of a number of layers of carbon (operation 1402). This tube has a number of optical properties configured to propagate the optical signal and a number of electrical properties configured to conduct the electrical signal.

The optical signal, the electrical signal, or both are received and processed by a second device (operation 1404) with the process terminating thereafter. In operation 1404, the second device may decode or use the information encoded in at least one of the optical signal and the electrical signal. In other illustrative examples, the second device may amplify at least one of the optical signal and the electrical signal and retransmit these signals to yet another device. In other words, the second device may operate as a repeater or an amplifier. Further, this repeater or amplifier may be purely electrical, purely optical, or use optical-electrical or electro-optical conversion.

In still other illustrative examples, the first device may transmit the electrical signal as a power signal. The second device may receive and use the electrical signal as a power source for the different circuits within the second device.

Figure 15:
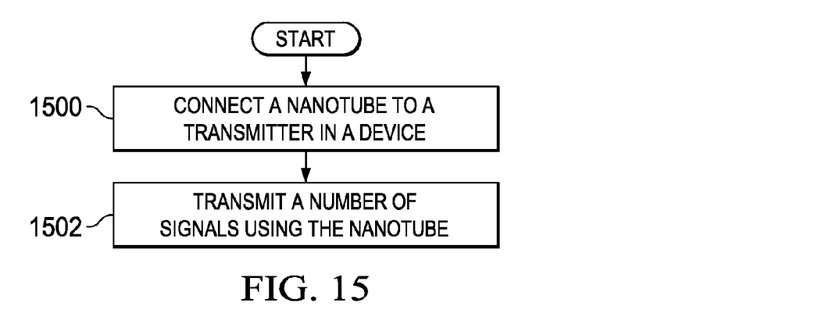
FIG. 15 is an illustration of a flowchart of a process for transmitting a signal in accordance with an illustrative embodiment.

Turning now to FIG. 15, an illustration of a flowchart of a process for transmitting a signal is depicted in accordance with an illustrative embodiment. The process illustrated in FIG. 15 may be implemented in an information environment, such as information environment 100 in FIG. 1. In particular, this process may be implemented using device 400 in FIG. 4. More specifically, this process may be implemented using transmitter 404 in device 400.

The process begins by connecting a nanotube to a transmitter in a device (operation 1500). The process then transmits a number of signals using the nanotube (operation 1502) with the process terminating thereafter. In this illustrative example, operation 1500 may include transmitting at least one of an optical signal and an electrical signal. In these illustrative examples, both an optical signal and an electrical signal may be transmitted at the same time using the nanotube.

Figure 16:
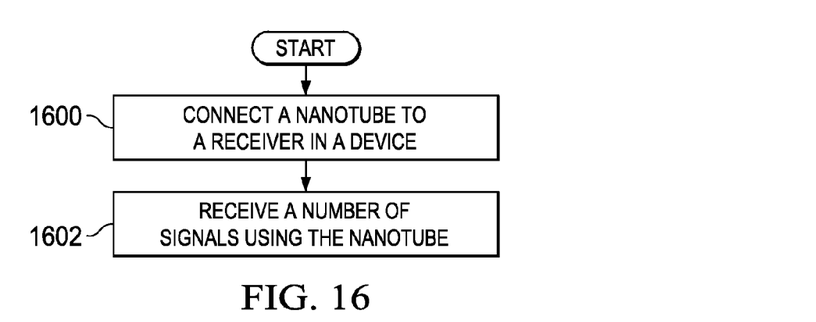
FIG. 16 is an illustration of a flowchart of a process for transmitting a signal in accordance with an illustrative embodiment.

Turning now to FIG. 16, an illustration of a flowchart of a process for transmitting a signal is depicted in accordance with an illustrative embodiment. The process illustrated in FIG. 16 may be implemented in an information environment, such as information environment 100 in FIG. 1. In particular, this process may be implemented using device 400 in FIG. 4. More specifically, this process may be implemented using receiver 402 in device 400.

The process begins by connecting a nanotube to a receiver in a device (operation 1600). The process then receives a number of signals using the nanotube (operation 1602) with the process terminating thereafter. In this illustrative example, operation 1600 may include transmitting at least one of an optical signal and an electrical signal. In these illustrative examples, both an optical signal and an electrical signal may be transmitted at the same time using the nanotube.

The flowcharts and block diagrams in the different depicted embodiments illustrate the architecture, functionality, and operation of some possible implementations of apparatus and methods in an illustrative embodiment. In this regard, each block in the flowcharts or block diagrams may represent a module, segment, function, and/or a portion of an operation or step. For example, one or more of the blocks may be implemented as program code, in hardware, or a combination of the program code and hardware. When implemented in hardware, the hardware may, for example, take the form of integrated circuits that are manufactured or configured to perform one or more operations in the flowcharts or block diagrams.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

For example, the operations in FIGS. 15 and 16 may be combined when the device includes a transceiver. A transceiver may send a signal while receiving a signal at the same time. For example, an optical signal may be transmitted while an electrical signal is received.

Thus, the illustrative embodiments provide a method and apparatus for transmitting optical signals and electrical signals. These signals may be transmitted at the same time through the same tube in a communications link. The illustrative examples employ tubes formed from a number of layers of carbon in which the structure of the number of layers of carbon is selected to have optical properties for propagating photons and electrical properties for conducting electrons.

As described above, these tubes may be nanotubes and the number of layers of carbon may be a number of layers of graphene. By using nanotubes in communications links, the size and weight of communications links may be reduced. As a result, the size and weight of a communications system that transmits information and power may be reduced as compared to currently used optical communications links and wire links. This reduction in size and weight may increase the ease at which size, weight, power and other constraints in aircraft or other platforms may be met as compared to using metal wires and/or optical fibers.

Further, the number of nanotubes in an area, with the increased surface area "skin effect" for electrons will greatly decrease the conductivity, and greatly increase the electrical power that can be transferred. Similarly, the increased number of nanotubes will greatly increase the number of individual optical transmission media, and therefore greatly increase the bandwidth of the medium.

Additionally, the illustrative embodiments also provide devices that are configured to communicate using the tubes. These devices may communicate using at least one of optical signals and electrical signals. In the illustrative examples, these signals may encode information. Further, in some illustrative examples, the electrical signals may also be used to provide power to the circuits in the different devices.

The description of the different illustrative embodiments has been presented for purposes of illustration and description, and is not intended to be exhaustive or limited to the embodiments in the form disclosed. Many modifications and variations will be apparent to those of ordinary skill in the art.

For example, although some of the illustrative examples show the use of electrical signals to supply power, the optical signals also may be used to supply power. When optical signals are used to supply power, circuits and other devices may be included to generate optical signals that are configured to be used to power devices as well as circuits and other devices that may be included to receive and use the optical energy for supplying power.

Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An apparatus comprising:
a device configured to communicate using an optical signal and an electrical signal through a connection to a tube comprised of a number of layers of carbon forming a wall of the tube, wherein the number of layers of carbon has a number of optical properties configured to propagate the optical signal within a channel in the tube and a number of electrical properties configured to conduct the electrical signal along a surface of the wall of the tube; and
the device comprising a circuit powered by a voltage difference that occurs as the electrical signal travels through the tube and as a magnetic field is applied to the electric signal;
wherein the voltage difference is a Hall Effect voltage.

2. The apparatus of claim 1, wherein the device comprises:
a receiver configured to receive the optical signal and the electrical signal using the tube.

3. The apparatus of claim 2, wherein the receiver comprises:
a magnetic field generator configured to generate the voltage difference between a first side of the tube and a second side of the tube when the electrical signal is received; and
the circuit configured to operate using the voltage difference.

4. The apparatus of claim 3,
wherein the circuit is one of:
a transmitter comprising an amplifier and an optical emitter that are powered by the voltage difference via a connection to the first side and the second side, and
a receiver comprising an optical detector and a decoder that are powered by the voltage difference via a connection to the first side and the second side.

5. The apparatus of claim 2, wherein the receiver comprises:

a circuit configured to supply a current to a portion of the device using the current generated by the electrical signal conducting through the tube.

6. The apparatus of claim 5, wherein the tube and a number of additional tubes comprised of a number of additional layers of carbon form a communications link.

7. The apparatus of claim 1, wherein the device comprises:
a transmitter configured to transmit the optical signal and the electrical signal using the tube.

8. The apparatus of claim 7, wherein the transmitter comprises:
a power supply configured to transmit power using at least one of the optical signal and the electrical signal.

9. The apparatus of claim 7, wherein the transmitter comprises:
an encoder configured to encode information in the electrical signal.

10. The apparatus of claim 1, wherein the number of layers of carbon is from one layer to three layers.

11. The apparatus of claim 1, wherein the number of layers of carbon is a number of layers of graphene.

12. The apparatus of claim 1, wherein the tube is a carbon nanotube.

13. The apparatus of claim 1, wherein the device is selected from one of a computer, a tablet computer, a sensor, an actuator, a repeater, a switch, a router, and a network node.

14. A communications system comprising:
a first device configured to transmit an optical signal and an electrical signal using a tube comprised of a number of layers of carbon forming a wall of the tube, wherein the number of layers of carbon has a number of optical properties configured to propagate the optical signal and a number of electrical properties configured to conduct the electrical signal simultaneously; and
a second device configured to receive the optical signal and the electrical signal using the tube, the second device comprising a circuit powered by a voltage difference that occurs as the electrical signal travels through the tube and as a magnetic field is applied to the electric signal;
wherein the voltage difference is a Hall Effect voltage.

15. The communications system of claim 14 further comprising:
a power supply configured to transmit power using at least one of the optical signal and the electrical signal.

16. A method for communicating, the method comprising:
communicating, by a device, at least one of an optical signal and an electrical signal using a tube comprised of a number of layers of carbon forming a wall of the tube, wherein the number of layers of carbon has a number of optical properties configured to propagate the optical signal and a number of electrical properties configured to conduct the electrical signal and wherein the device is configured to communicate using both the optical signal and the electrical signal; and
powering a circuit comprised by the device by a voltage difference that occurs as the electrical signal travels through the tube and as a magnetic field is applied to the electric signal;
wherein the voltage difference is a Hall Effect voltage.

17. The method of claim 16, wherein the device is a first device and wherein communicating comprises:
transmitting information in the at least one of the optical signal and the electrical signal to a second device using the tube.

18. The method of claim 16, wherein the device is a first device and wherein communicating comprises:
transmitting power to a second device in the at least one of the optical signal and the electrical signal using the tube.

19. The method of claim 16 further comprising:
applying the magnetic field to the electrical signal in the tube such that the voltage difference is present between a first side of the tube and a second side of the tube; and
powering the circuit using the voltage difference.

* * * * *